United States Patent
Dong et al.

(10) Patent No.: US 10,534,218 B2
(45) Date of Patent: Jan. 14, 2020

(54) BACKLIGHT MODULE, FABRICATION METHOD, AND DISPLAY APPARATUS

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Ruijun Dong, Beijing (CN); Dong Chen, Beijing (CN); Guangquan Wang, Beijing (CN); Haiwei Sun, Beijing (CN); Lili Chen, Beijing (CN); Zhihui Zeng, Beijing (CN); Lu Yu, Beijing (CN); Jianjie Wu, Beijing (CN); Qian Wang, Beijing (CN); Wei Sun, Beijing (CN); Huijuan Chen, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/505,922

(22) PCT Filed: Jul. 1, 2016

(86) PCT No.: PCT/CN2016/088166
§ 371 (c)(1),
(2) Date: Feb. 22, 2017

(87) PCT Pub. No.: WO2017/117933
PCT Pub. Date: Jul. 13, 2017

(65) Prior Publication Data
US 2019/0086726 A1 Mar. 21, 2019

(30) Foreign Application Priority Data

Jan. 4, 2016 (CN) .......................... 2016 1 0004821

(51) Int. Cl.
*H01L 33/00* (2010.01)
*G02F 1/13357* (2006.01)
(Continued)

(52) U.S. Cl.
CPC ........ *G02F 1/133603* (2013.01); *H01S 5/005* (2013.01); *H01S 5/0425* (2013.01);
(Continued)

(58) Field of Classification Search
CPC ...... G02F 1/133603; H01S 5/00; H01S 5/005; H01L 33/004
(Continued)

(56) References Cited

U.S. PATENT DOCUMENTS 5,521,754 A * 5/1996 Nitta .................. H01S 5/50
359/344
8,104,945 B2 1/2012 Kim et al.
(Continued)

FOREIGN PATENT DOCUMENTS

EP 2372790 A2 10/2011
KR 20140047855 A 4/2014

OTHER PUBLICATIONS

International Search Report and Written Opinion dated Oct. 9, 2016 in PCT/CN2016/088166.
(Continued)

*Primary Examiner* — Jami Valentine Miller
(74) *Attorney, Agent, or Firm* — Syncoda LLC; Feng Ma

(57) ABSTRACT

The present disclosure provides a backlight module, which includes at least one quantum wire unit. The at least one quantum wire unit is configured to have an effective wire (Continued)

width such that the at least one quantum wire unit is capable of converting electric energy to emit light of a selected wavelength. Each of quantum wire unit comprises a first electrode, disposed on a first side of a substrate layer; a first buffer layer, disposed on a second side of the substrate layer; an active layer, disposed over the first buffer layer; a second buffer layer, disposed over the active layer; and a second electrode disposed over the second buffer layer. Each quantum wire unit, along with the substrate layer, forms a quantum wire laser generator, which is configured such that the active layer emits light upon application of a voltage difference between the first electrode and the second electrode.

19 Claims, 11 Drawing Sheets

(51) Int. Cl.
*H01S 5/00* (2006.01)
*H01S 5/042* (2006.01)
*H01S 5/22* (2006.01)
*H01S 5/34* (2006.01)
*H01S 5/343* (2006.01)
*H01S 5/40* (2006.01)

(52) U.S. Cl.
CPC ............ *H01S 5/2202* (2013.01); *H01S 5/341* (2013.01); *H01S 5/34333* (2013.01); *H01S 5/4093* (2013.01); *G02F 2001/133614* (2013.01); *G02F 2202/36* (2013.01)

(58) Field of Classification Search
USPC .......................................................... 257/9
See application file for complete search history.

(56) References Cited

U.S. PATENT DOCUMENTS

| | | | |
|---|---|---|---|
| 9,196,653 B2 | 11/2015 | Leatherdale et al. | |
| 2009/0196015 A1* | 8/2009 | Huang | F21V 9/30 362/84 |
| 2011/0001693 A1* | 1/2011 | Kim | G02B 6/0068 345/102 |
| 2011/0164402 A1 | 7/2011 | Kang et al. | |
| 2012/0032142 A1* | 2/2012 | Leatherdale | H01L 27/156 257/13 |
| 2012/0119237 A1* | 5/2012 | Leatherdale | H01L 27/156 257/88 |

OTHER PUBLICATIONS

European Extended Search Report (EESR) dated Sep. 5, 2019 in EP16816165.1.

* cited by examiner

V-shaped groove

V-shaped groove

V-shaped groove

V-shaped groove

| Forming a quantum wire array over a top surface of a substrate layer, the quantum wire array comprising a plurality of quantum wire array units. |—S101

↓

| Forming a first electrode over a bottom surface of the substrate layer. |—S102

BACKLIGHT MODULE, FABRICATION METHOD, AND DISPLAY APPARATUS

CROSS-REFERENCE TO RELATED APPLICATION

The present application claims priority to Chinese Patent Application No. 201610004821.1 filed on Jan. 4, 2016, the disclosure of which is hereby incorporated by reference in its entirety.

TECHNICAL FIELD

This disclosure relates generally to display technologies, and more specifically to a backlight module, a fabrication method thereof, and a display apparatus.

BACKGROUND

As a flat-panel display device, a Liquid Crystal Display (LCD) has advantages such as low energy consumption, low radiation, low cost, etc., and has thus been increasingly applied in the field of high-performance displays. Because LCD is a passive light-emitting display device, a backlight unit (BLU), or a backlight module, is needed to provide a light source to the LCD device for displaying images.

SUMMARY

The present disclosure provides a backlight module, a fabrication method thereof, and a display apparatus. At least some of the embodiments disclosed herein can alleviate or solve problems associated with large thicknesses in current backlight modules.

In an aspect, the present disclosure provides a backlight module, which includes at least one quantum wire unit. The at least one quantum wire unit is configured to have an effective wire width such that the at least one quantum wire unit is capable of converting electric energy to emit light of a selected wavelength.

In some embodiments, each of the at least one quantum wire unit comprises: a first electrode, disposed on a first side of a substrate layer; a first buffer layer, disposed on a second side of the substrate layer; an active layer, disposed over the first buffer layer; a second buffer layer, disposed over the active layer; and a second electrode disposed over the second buffer layer. Each of the at least one quantum wire unit, along with the substrate layer, forms a quantum wire laser generator, configured such that the active layer emits light upon application of a voltage difference between the first electrode and the second electrode.

In each of the at least one quantum wire unit, the second buffer layer comprises an overlapping portion, disposed over the first buffer layer and the active layer; and at least one non-overlapping portion, disposed over the substrate layer but not over the first buffer layer and the active layer. The second electrode comprises two end portions and a middle portion. The two end portions of the second electrode are disposed over the overlapping portion of the second buffer layer at two end portions of the each of the at least one quantum wire unit along the dimension of length. The middle portion of the second electrode is disposed over the at least one non-overlapping portion of the second buffer layer at a middle portion of the each of the at least one quantum wire unit along the dimension of length.

In some embodiments, each of the at least one quantum wire unit further includes a contact layer, which is sandwiched between the second buffer layer and the second electrode, and is configured to increase a conductivity of the second electrode.

In some embodiments, at least one groove is arranged on a surface of the second side of the substrate layer, and is configured to facilitate formation of the active layer of one of the at least one quantum wire unit on the second side of the substrate layer.

The grooves can take a shape to thereby allow forming the active layer being free to grow along an extension direction of the groove, but having a quantum well effect excluding the extension direction of the groove. Examples of the shape for the grooves include V-shape, U-shape, crescent shape, trapezoid shape, or inverse trapezoid shape.

Herein, "quantum well effect" refers to an effect where the carriers in the active layer are contained to move only along the extension direction of the groove because the thickness and width of the active layer reduce to a scale of the Bohr radius or the de Broglie wavelength. "Shape" refers to a cross-sectional shape of the groove on the plane that is perpendicular to the extension direction of the groove.

In some embodiments, each groove is configured to have bulges at rims of opening of the groove.

In some embodiments, the backlight module further comprises a packaging layer, which is disposed over surface of the quantum wire units, and can have a composition of epoxy resin.

In some embodiments of the backlight module, the active layer can have a composition of Si, Ge, Carbon nanotube, GaAs, InGaAs, AlGaAs, InAs, InP, InN, GaN, ZnO, $ZnO_2$, CdMnTe, ZnSe, or SiC.

In some embodiments of the backlight module, the quantum wire units are configured to emit light of at least one of blue, red, green, cyan, yellow, or magenta.

In some embodiments, the backlight module can further include at least one reflection layer. Each reflection layer is disposed on a side surface of the substrate layer, and the side surface of the substrate layer is perpendicular to the dimension of length of the quantum wire unit. Each reflection layer is configured to reflect light emitted from at least one of the two end portions of the at least one quantum wire unit.

In another aspect, this disclosure also provides a display apparatus. The display apparatus can include a backlight module according to any of the embodiments as described above.

In some embodiments, the display apparatus can further include a lower polarizer film, an upper polarizer film, and a liquid crystal display panel. The lower polarizer film is disposed over a light-emitting side of the backlight module; the liquid crystal display panel is disposed over a top side of the lower polarizer film; and the upper polarizer film is disposed over a top side of the liquid crystal display panel.

In some embodiments, the display apparatus can further include a self-polarizing grating, which can be disposed over the top side of the substrate layer in the backlight module and is configured to modulate light emitted from the quantum wire array. The quantum wire units in the backlight module can form a plurality of quantum wire arrays, arranged such that a separation zone is arranged between every two neighboring quantum wire arrays on the top side of the substrate layer. The self-polarizing grating can include a plurality of shielding portions, separated from one another, and each of the plurality of shielding portions is disposed within the separation zone.

In some of these embodiments, the separation zone is around 50 nm, and each shielding portion has a width of around 50-80 nm and a height of around 100-150 nm.

In some of these embodiments, each shielding portion has a composition of a metal, and is coated with an insulating layer.

The display apparatus can further comprising a liquid crystal display panel and an upper polarizer film. The liquid crystal display panel is disposed over a light-emitting side of the self-polarizing grating; and the upper polarizer film is disposed over a light-emitting side of the liquid crystal display panel. In these embodiments, the display apparatus can further include a flattening layer, which is disposed between the self-polarizing grating and the liquid crystal display panel.

The liquid crystal display panel can include an array substrate, and the array substrate comprises a plurality of pixels, and each of the plurality of pixels corresponds to one set of quantum wire unit, wherein one set of quantum wire unit comprises at least one quantum wire unit.

In some embodiments, three sets of quantum wire units corresponding respectively to three pixels in a pixel unit are configured to have different effective wire widths so as to emit light of three primary colors, selected from blue, red, and green, or cyan, yellow, and magenta.

In some other embodiments, each set of quantum wire units corresponding respectively to one pixel comprises three sub-sets of quantum wire units, configured to have different effective wire widths so as to emit light of three primary colors, selected from blue, red, and green, or cyan, yellow, and magenta.

In some embodiments of the display apparatus, each quantum wire unit can have a same effective wire width and thereby emit light of a same color. The liquid crystal display panel can further include a color film substrate, and the display apparatus can comprise a photoluminescent layer, which is disposed over a top side of the array substrate. The color film substrate is disposed over the photoluminescent layer and below the upper polarizer film.

In yet another aspect, the disclosure provides method of fabricating a backlight module. The method comprises:

Providing a substrate layer; and

Forming a quantum wire array including a plurality of quantum wire units with the substrate layer.

In the step of forming a quantum wire array, each of the plurality of quantum wire units comprises: a first electrode, disposed over a first side of a substrate layer; a first buffer layer, disposed over a second side of the substrate layer; an active layer, disposed over the first buffer layer; a second buffer layer, disposed over the active layer; and a second electrode disposed over the second buffer layer. Each of the at least one quantum wire unit, along with the substrate layer, forms a quantum wire laser generator, configured such that the active layer emits light upon application of a voltage difference between the first electrode and the second electrode.

Prior to the step of forming the quantum wire array, the method can include a step of: etching a plurality of grooves over surface of the second side the substrate layer, wherein each of the plurality of grooves is arranged below, and configured to facilitate formation of, the active layer of one of the plurality of quantum wire units on the second side of the substrate layer.

The step of forming the quantum wire array can include: sequentially forming the first buffer layer, the active layer, the second buffer layer, and the second electrode over each of the plurality of grooves by epitaxial growth.

Other embodiments and implementations may become apparent in view of the following descriptions and the attached drawings.

BRIEF DESCRIPTION OF DRAWINGS

To more clearly illustrate the embodiments of the disclosure, the following is a brief description of the drawings, which are for illustrative purpose only. For those of ordinary skills in the art, other drawings of other embodiments can become apparent based on these drawings.

DETAILED DESCRIPTION

In the following, with reference to the drawings of various embodiments disclosed herein, the technical solutions of the embodiments of the invention will be described in a clear and fully understandable way. It is noted that the described embodiments are merely a portion but not all of the embodiments of the invention. Based on the described embodiments of the invention, those ordinarily skilled in the art can obtain other embodiment(s), which come(s) within the scope sought for protection by the invention.

Depending on the different locations of the light sources, backlight modules can be include a direct-lit type (also referred to as straight-down type), or an edge-lit type (also referred to as a side-in type).

Figure 1A:
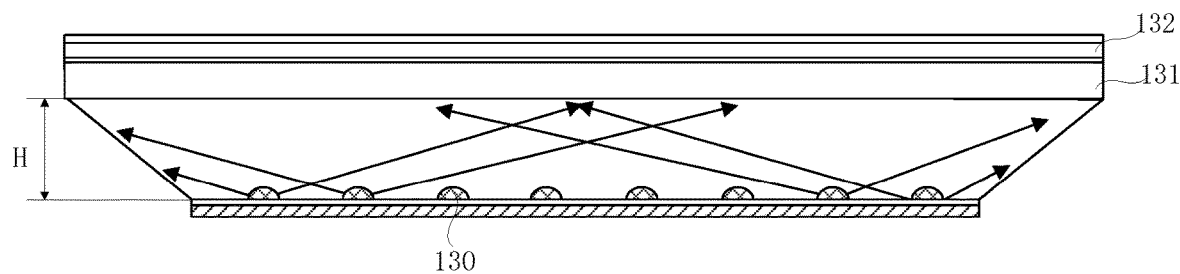
FIG. 1A is a schematic diagram of a direct-lit type backlight module.

A direct-lit backlight module is shown in FIG. 1A, where a white light source 130, such as a cold cathode fluorescent lamp (CCFL), or a light emitting diode (LED), is disposed behind a liquid crystal panel. Light can be evenly diffused through a diffusion plate to become an area light source for the liquid crystal panel. Because the light mixing distance H between the light source 130 and the diffusion plate 131 is positively correlated with the uniformity of the light, the shorter the light mixing distance H, the poorer the uniformity of the backlight. As such, the light mixing distance H can cause difficulties in manufacturing a thin, direct-lit type backlight module.

Figure 1B:
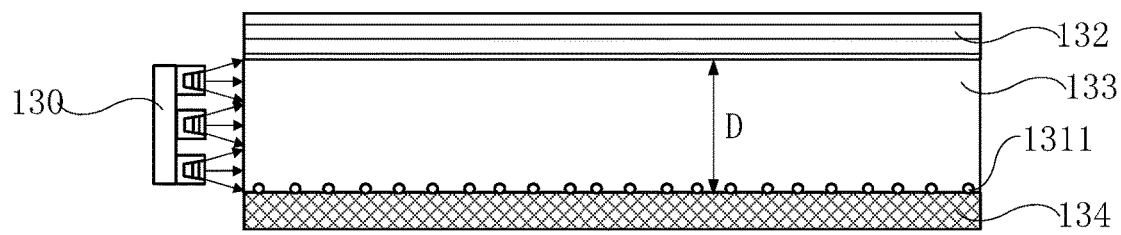
FIG. 1B is a schematic diagram of an edge-lit type backlight module.

An edge-lit backlight module is illustrated in FIG. 1B, where a light source 130 is disposed at a side of a light guide plate 133. Light emitted from the light source 130 enters the light guide plate 133 from a side, and an area light source for the liquid crystal panel can be formed after light reflection by the reflection plate 134 and scattering by the netted dots 1311.

Because the light extraction efficiency of the light guide plate 133 is positively correlated with its thickness D, the light extraction efficiency is lower and the light loss is greater for thinner D. As such, the thickness D of the light guide plate 133 can cause difficulties in manufacturing a thin edge-lit type backlight module.

For either a direct-lit type or an edge-lit type backlight module, typically at least one optical film 132, such as a multi-layer optical prism, is included, further increasing the thickness of the backlight module. All these factors have impeded the designs for thin LCDs.

To address these above issues, the present disclosure provides a backlight module, which includes at least one quantum wire unit, configured to have an effective wire width such that the at least one quantum wire unit is capable of converting electric energy to emit light of a selected wavelength.

Figure 2A:
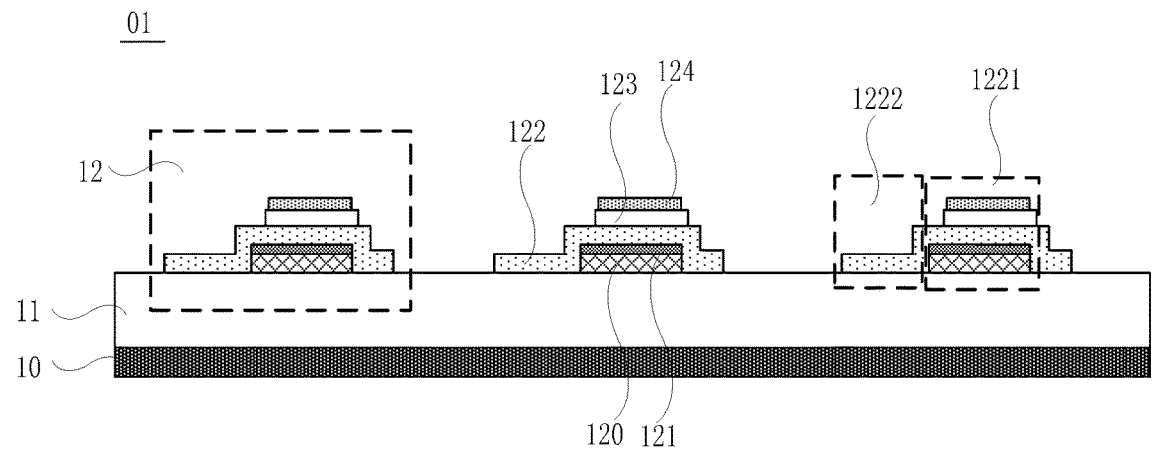
FIG. 2A is a schematic diagram of a backlight module according to a first embodiment.

A backlight module 01 according to some embodiments is illustrated in FIG. 2A. The backlight module 01 includes a first electrode 10, and a substrate layer 11. The substrate layer 11 is disposed over the top surface of the first electrode 10. The substrate layer can comprise a glass substrate, a sapphire substrate, or can be a flexible substrate made of plastic or other materials.

Figure 2B:
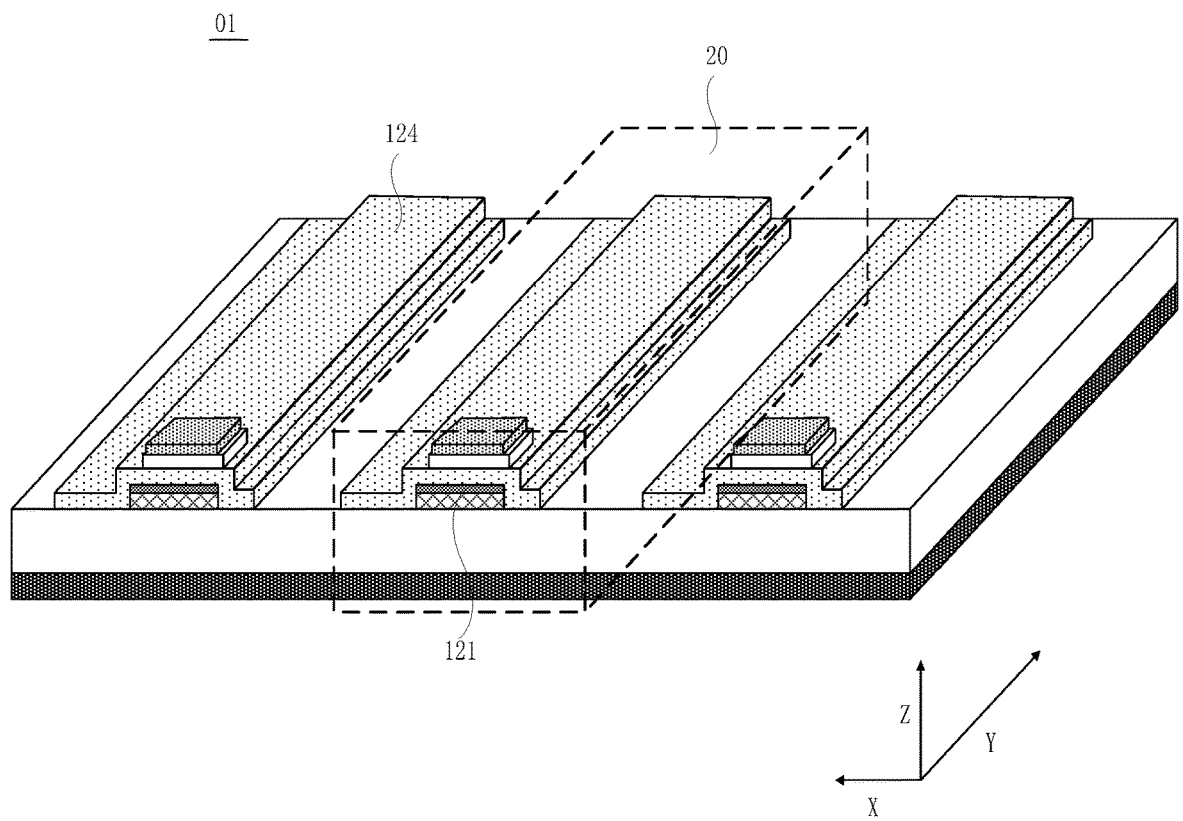
FIG. 2B is a schematic diagram of a three-dimensional structure of the backlight module as illustrated in FIG. 2A.
Figure 2C:
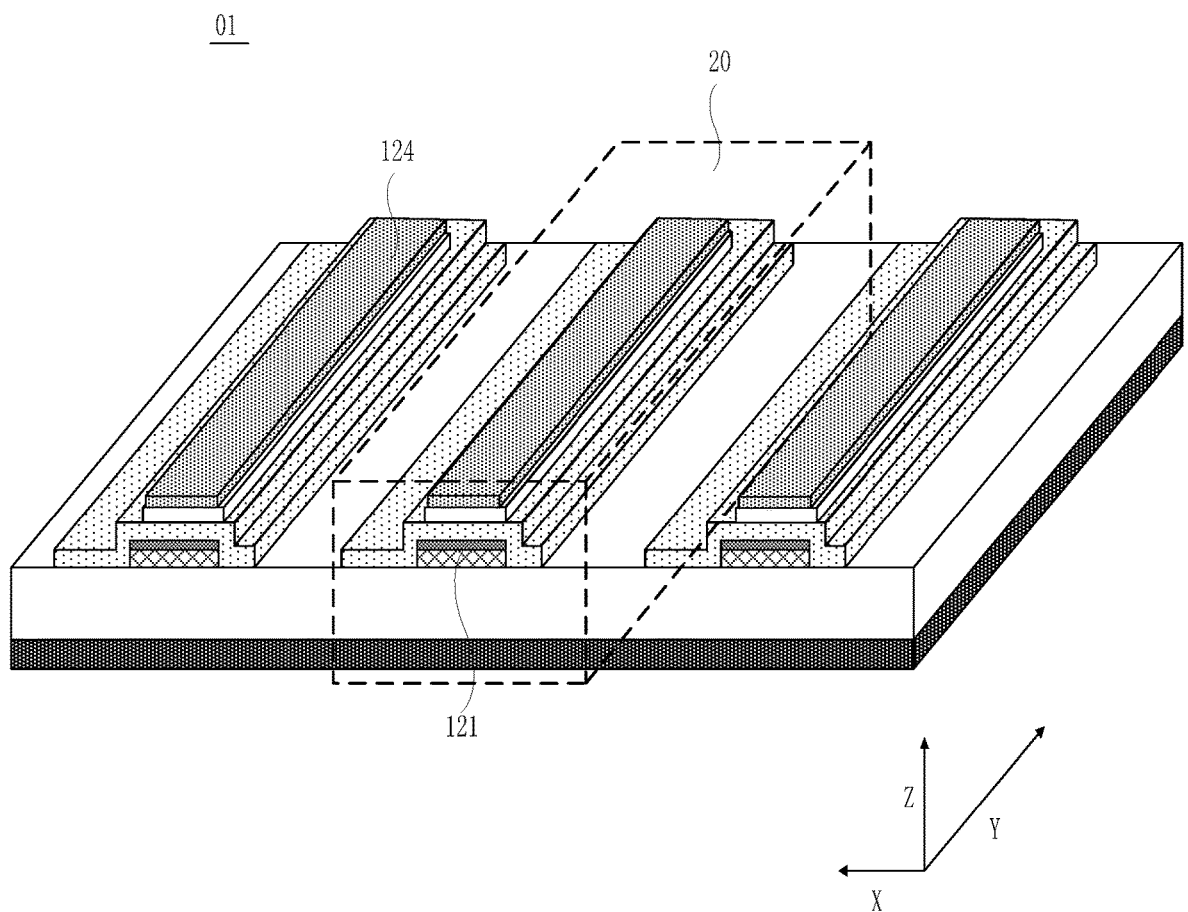
FIG. 2C is a schematic diagram of a backlight module according to a second embodiment.
Figure 2D:
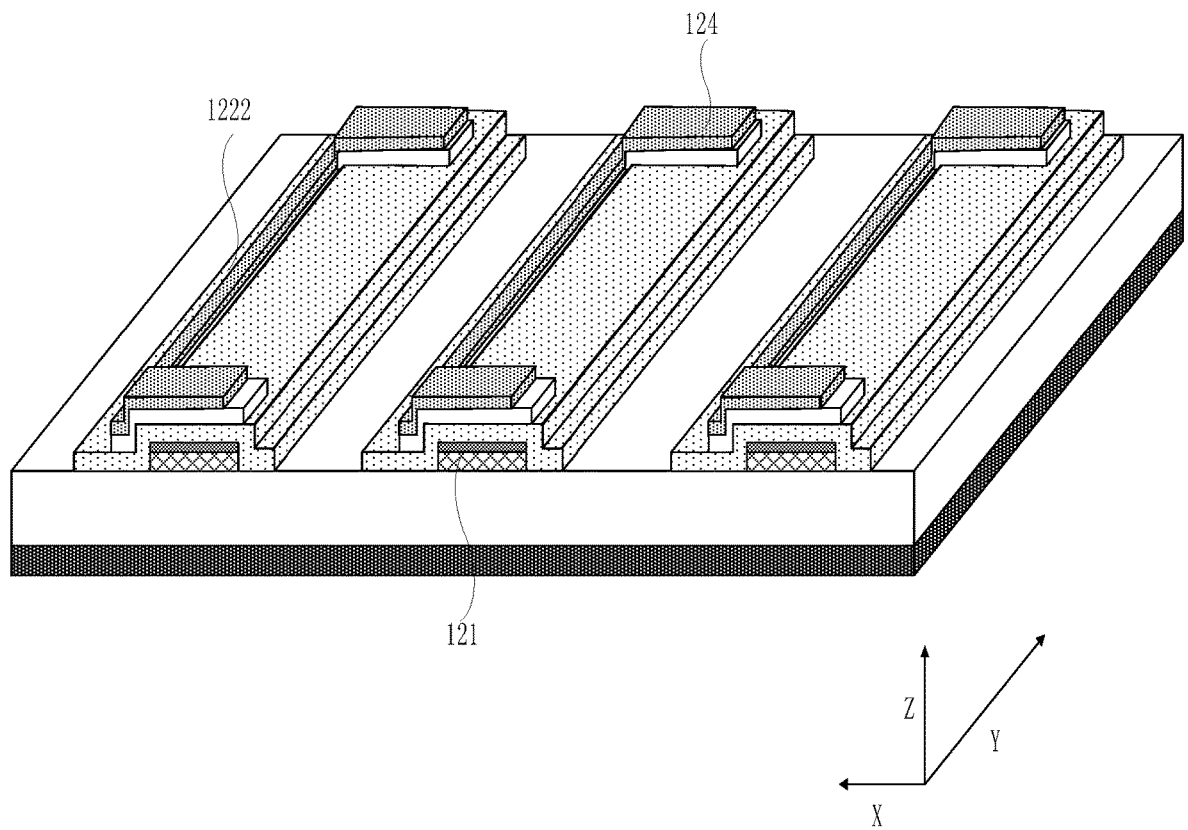
FIG. 2D is a schematic diagram of a backlight module according to a third embodiment.
Figure 2E:
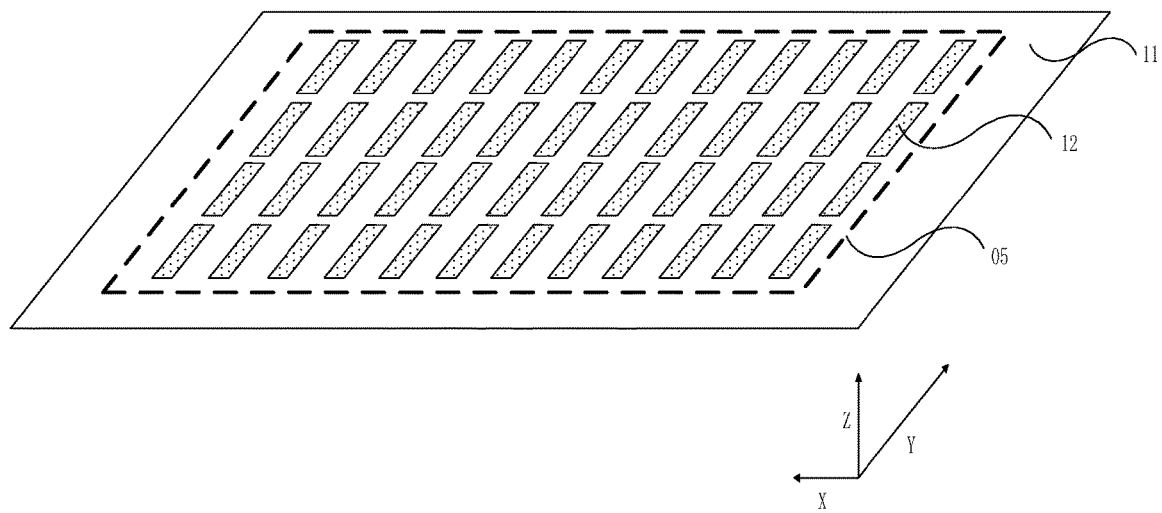
FIG. 2E is a schematic diagram of a quantum wire array according to some embodiments.

As shown in FIG. 2E, the top surface of the substrate layer 11 can have a quantum wire array 05 disposed thereon. The quantum wire array comprises a plurality of quantum wire array units 12, arranged in a matrix, which can be an M×N array, where M and N are integers ≥1.

The quantum wires can be formed with Si, Ge, Carbon nanotubes, GaAs, InGaAs, AlGaAs, InAs, InP, InN, GaN, ZnO, $ZnO_2$, CdMnTe, ZnSe, SiC, etc. The quantum wires can have an effective wire width of less than 10 nm, for example. The lengths of the quantum wires can be limited by the size of the display panel, the fabrication method, etc., but otherwise are not limited. In some embodiments, the lengths can be longer than a pixel size and correspond to a plurality of pixels. In some other embodiments, the lengths can be similar to a pixel size.

In some embodiments, as illustrated in FIG. 2A, each of the quantum wire array units 12 comprises a first buffer layer 120, an active layer 121, a second buffer layer 122, and a second electrode 124. In some embodiments, the second buffer layer 122 can completely cover the first buffer layer 120 and the active layer 121; the second buffer layer 122 can include an overlapping zone 1221, which overlaps with the first buffer layer 120, and a non-overlapping zone 1222, which refers to the region excluding the overlapping zone 1221. The second electrode 124 can overlap with part of the overlapping zone 1221. It should be noted that a functional quantum wire array unit should also include the first electrode 10 and the substrate layer 11, but for simplicity and highlight, the quantum wire array unit 12 as indicated by the dotted box do not include the first electrode 10 and the substrate layer 11.

The active layer 121 can have a composition of a ternary semiconductor compound, such as InGaAs or InGaN, for example.

The first buffer layer 120 or the second buffer layer 122 can have a composition similar to that of the active layer 121, and can be a related P-type or an N-type semiconductor material. The first buffer layer 120 or the second buffer layer 122 can be configured to supply carriers to the active layer 121. The first buffer layer 120 can have a high-quality epitaxial surface, configured to reduce the tension between the substrate layer 11 and other layers, to thereby reduce or stop the spread of defects from the substrate layer 11 to other layers. This is beneficial for the acoustic field for the other layers in each of the quantum wire array units.

In addition, the first buffer layer 120 can contain the spread of the transverse mode of optical field to the substrate layer, and the second buffer layer 122 can contain the spread of the transverse mode of optical field to the second electrode 124. As such, the buffer layers can reduce light loss, decrease barrier potentials, reduce voltage loss, and increase the light-emitting efficiency.

Each quantum wire array unit 12 can be additionally provided with a contact layer 123, disposed between the second buffer layer 122 and the second electrode 124. The contact layer 123 can be doped with a higher concentration of metal than the second buffer layer 122. As such, by contacting the second electrode 124, the contact layer 123 can increase the conductivity of the second electrode 124.

In some embodiments, each of the quantum wire array units 12, together with the substrate layer 11 at a corresponding position and the first electrode 10, can form a quantum wire laser generator 20. A light-emitting mechanism of the quantum wire laser generator is described below.

In some embodiments, the active layer 121 in each quantum wire laser generator 20 can have a composition of a semiconductor material. In some embodiments, the active layer 121 can have a thickness of 0.1-0.3 µm. If the thickness of the active layer 121 reduces to a scale of the Bohr radius or the de Broglie wavelength (e.g., nanometer scale), a scale effect occurs, where the carriers in the laser are contained in the potential well in the active layer, referred to as a quantum well.

As illustrated in FIG. 2B, the scale of the active layer 121 along the X axis is also reduced to less than a wavelength, carriers can only move in the active layer 121 along the Y axis, thereby forming a quantum wire. The carriers in the quantum wire can have different quantum capabilities. The quantum wire laser generator 20 can convert electric energy to optical energy during energy level transitions of the carriers via the linear quantum wire located at the center of the quantum wire laser generator 20.

To fabricate the semiconductor lasers, layers in the quantum wire array unit 12 can be fabricated in a way that is similar to the method of fabricating the active layer 121.

For an active layer 121 having a composition of a P-type semiconductor material, electrons are the majority carriers. Upon application of a positive voltage on the higher energy level and of a negative voltage on the lower energy level, electrons in the active layer 121 accumulates to the higher energy level. If the amount of electrons goes beyond a threshold of the semiconductor material, tunneling effect occurs where a large amount of electrons transition from high energy levels to low energy levels.

Because electrons at high energy levels have a higher energy and electrons at low energy levels have a lower energy, a large amount of optical energy can be released during the transitions of the electrons from higher energy levels to low energy levels, thereby realizing the conversion of electric energy to optical energy. By adjusting the level of confinement of the quantum wire laser generator 20, a visible light or laser can be generated.

Alternatively, for an active layer 121 having a composition of an N-type semiconductor material, holes are the majority carriers. Upon application of a negative voltage on the higher energy level, where the holes are located in the active layer 121, and a positive voltage on the lower energy level, holes accumulate to the higher energy level.

If the amount of holes goes beyond a threshold of the semiconductor material, tunneling effect can occur where a large amount of holes transition from high energy levels to low energy levels. Therefore, a large amount of optical energy can be released during transition of the holes from higher energy levels to low energy levels, thereby realizing the conversion of electric energy to optical energy.

As shown in FIG. 2E, the quantum wire array 05 as described above can include M×N quantum wire array units 12, where M and N are respectively the number of quantum wire array units 12 along the axis of X and Y, or along the axis of Y and X, depending on the definition of rows and columns. There is no limitation on the relative orientation of the array. For the convenience of description, M and N are respectively the number of quantum wire array units 12 along the X axis and the Y axis.

In some embodiments, there is no limitation on the size of the quantum wire array unit 12 along the Y axis. For example, the size of the quantum wire array unit 12 can be comparable to the size of the substrate layer 11 along the Y axis, and in this case N=1.

However, with some limitations of the quantum wire fabrication process according to some embodiments, if the size of the substrate layer 11 along the Y axis is relatively large, the size of the quantum wire array unit 12 along the Y axis cannot be comparable to the size of the substrate layer 11 along the Y axis. In this situation, it is possible that the number of quantum wire array unit 12 along the Y axis N>1, as shown in FIG. 2E. Therefore, within the allowance of the manufacturing cost, a smaller number the quantum wire array units 12 along the Y axis may be desired.

In some embodiments, energy level transitions of the electrons between the first electrode 10 and the second electrode 124 can occur to emit light only when the quantum wire laser generator 20 is applied with a voltage difference on the first electrode 10 and the second electrode 124. As such, the second electrode 124 can be configured to overlap with part of the overlapping zone 1221, so as to ensure that the quantum wire laser generator 20 can function normally to emit light.

In this situation, the larger the overlapping area between the first electrode 10 and the second electrode 124, or the larger the overlapping area the second electrode 124 covers the overlapping zone 1221, the greater the number of carriers for which energy level transitions can occur. As a result, more light can be supplied to the backlight module 01. For this reason, the sizes of the active layer 121 and the second electrode 124 are preferably increased along the Y axis, as illustrated in FIG. 2C.

In some embodiments, the first electrode 10 and the second electrode 124 can have a composition of metals or transparent conductive materials, such as Indium Tin Oxides (ITO), or Indium Zinc Oxides (IZO). Because the first electrode 10 and the second electrode 124 can be manufactured to be very thin, such as on a nanometer scale, the light emitted by the active layer 121 can transmit through the second electrode 124 even if a metal material is used for the second electrode 124, although the light transmission effect is not as great as that if a transparent conductive material is used.

In addition, for each layer added on top of the active layer 121, more absorption of the light emitted by the active layer 121 can occur, thus reducing the light transmission efficiency. To ensure a certain amount of light emitted by the quantum wire laser generator 20, the sizes of the active layer 121 and the second buffer layer 122 can be increased along the Y axis, and the size of the active layer 121 along the Y axis can be configured to be equal to the size of the substrate layer 11 along the Y axis.

The second electrode 124 can be configured to cover the two ends of the active layer 121 along the Y axis, as well as the non-overlapping zone 1222 on the side of the active layer 121 (see, e.g., FIG. 2D). In this configuration, only two ends of the active layer 121 are covered with multiple layers, whereas other regions of the substrate layer 11 are covered with only the second buffer layer 122, thereby increasing the light emission efficiency of the active layer 121.

In some embodiments, the substrate layer 11 can have a composition of a hard material such as glass or sapphire, or of a flexible composition such as a resin.

In some embodiments, a backlight module is provided. The backlight module comprises a first electrode, and a substrate layer disposed over the surface of the first electrode. The surface of the substrate layer can have a quantum wire array disposed thereon, which comprises a plurality of quantum wire array units.

Besides the first electrode and the substrate layer, each quantum wire array unit also includes a first buffer layer, an active layer, a second buffer layer, a second electrode, and optionally a contact layer. The second buffer layer can be configured to completely cover the first buffer layer and the active layer. The second buffer layer can include an overlapping zone and a non-overlapping zone. The second buffer layer can overlap with the first buffer layer at the overlapping zone, and the second electrode can be configured to overlap with part of the overlapping zone.

As such, the substrate layer provides a substrate for growing the various layers in each of the quantum wire array units. The first buffer layer is configured to separate the active layer and the substrate layer; the second buffer layer is configured to separate the active layer and the second electrode or the contact layer. Each quantum wire array unit, together with part of the substrate layer and the first electrode at a corresponding position, can form a quantum wire laser generator.

Carriers in the quantum wire laser generator can have a scale effect, and be confined in the potential wells in the active layer to form quantum energy levels. Upon application of a voltage difference to the first electrode and the second electrode, energy level transitions can occur, subsequently generating photons, resulting in light emission. A light source for the backlight module can thus be formed.

In some embodiments, there is no need to provide a light guide plate, a diffusion plate, or multiple optical films in the backlight module. Based on the working principle of the quantum wire laser generators, the active layer can have a nanometer-scale thickness. Other layers can optionally also have nanometer-scale thicknesses. Therefore, a very thin backlight module can be realized, and subsequently very thin LCDs can be achieved.

In some embodiments, the quantum wires can be manufactured by epitaxial growth over a non-flat surface of the substrate, cleavage two-step epitaxial growth, high-surface-index epitaxial growth, thermal evaporation and chemical synthesis, or other methods.

Figure 3:
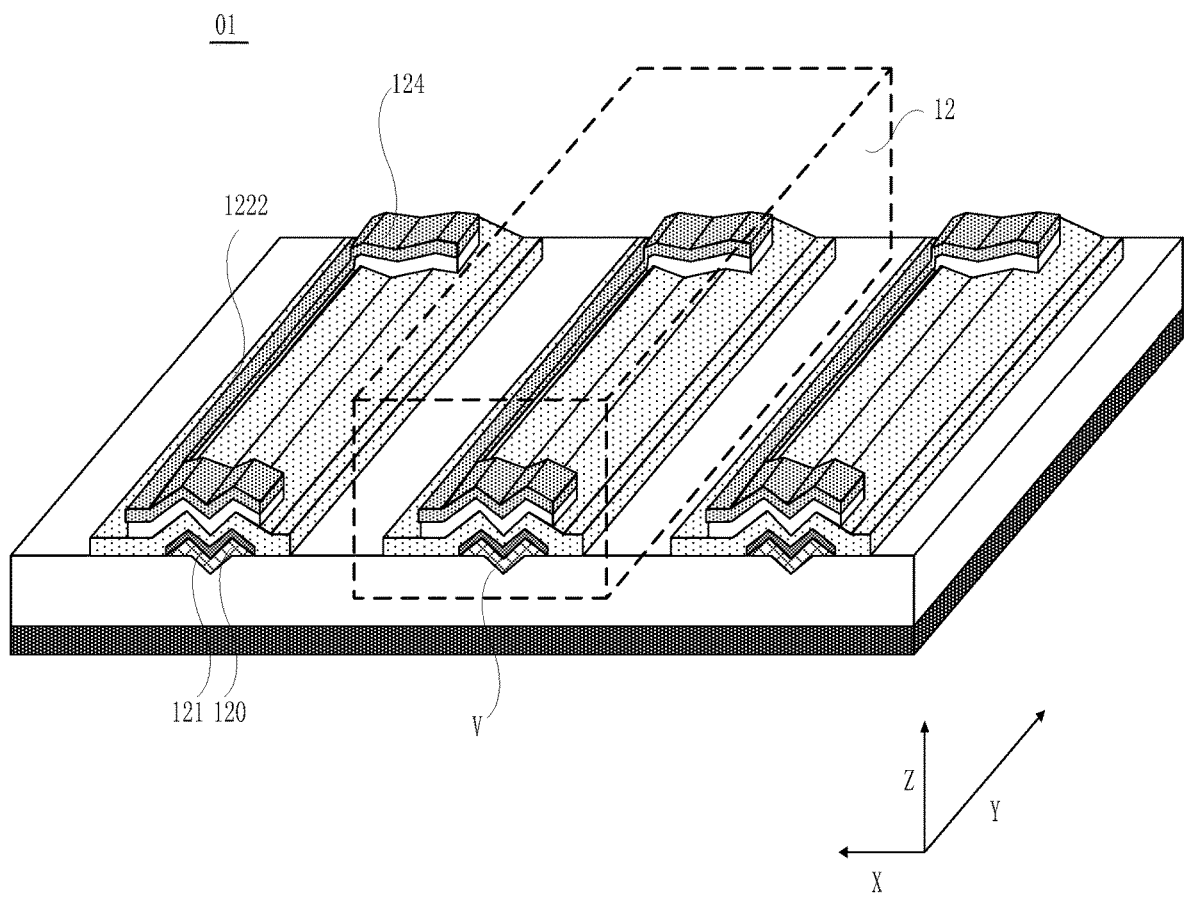
FIG. 3 is a schematic diagram of the backlight module as illustrated in FIG. 2D, which is provided with V-shaped grooves on the substrate.

If the quantum wires are fabricated by epitaxial growth on the non-flat surface of the substrate, as shown in FIG. 3, a plurality of grooves can be formed over the substrate layer 11 along the extending direction of the active layer 121. The grooves can be V-shaped, for example. Each V-shaped groove corresponds to, and is configured to guide the formation of a quantum wire array unit 12 over the V-shaped groove. The V-shaped grooves can be completely covered by the first buffer layer 120 and the active layer 121.

The extending direction of the active layer 121 can be along the Y axis, as illustrated in FIG. 3, e.g., the direction along which the carriers in the quantum wires can move freely. As such, the V-shaped grooves can facilitate the growth of the first buffer layer and the active layer along the Y axis, in turn facilitating the fabrication of the quantum wires.

Figure 4A:
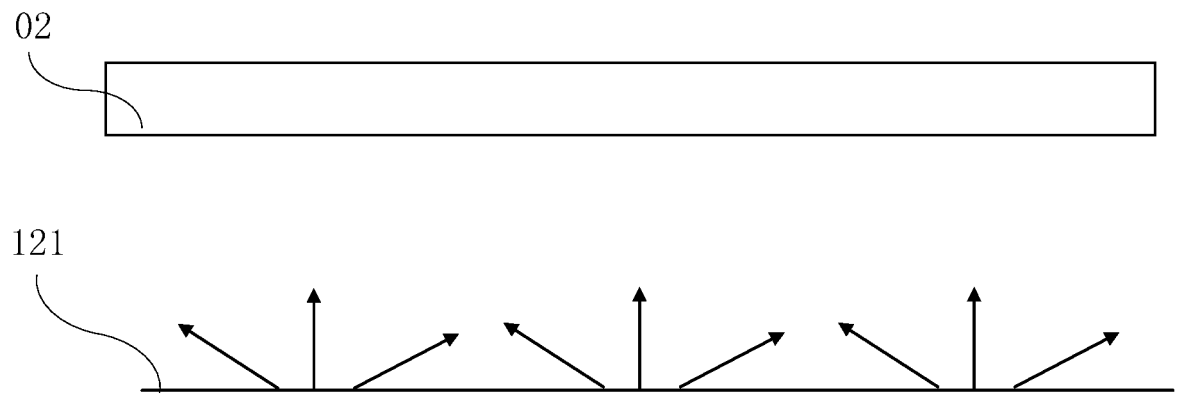
FIG. 4A is a diagram illustrating the light emission of the backlight module as illustrated in FIG. 2A, FIG. 2C and FIG. 2D.

For quantum wire array units 12 disposed over the substrate layer 11 without the V-shaped grooves, the light emitted by the active layer 121 can diffuse to various directions, as illustrated in FIG. 4A. This can reduce the utilization rate of the light in the backlight module 01.

Figure 4B:
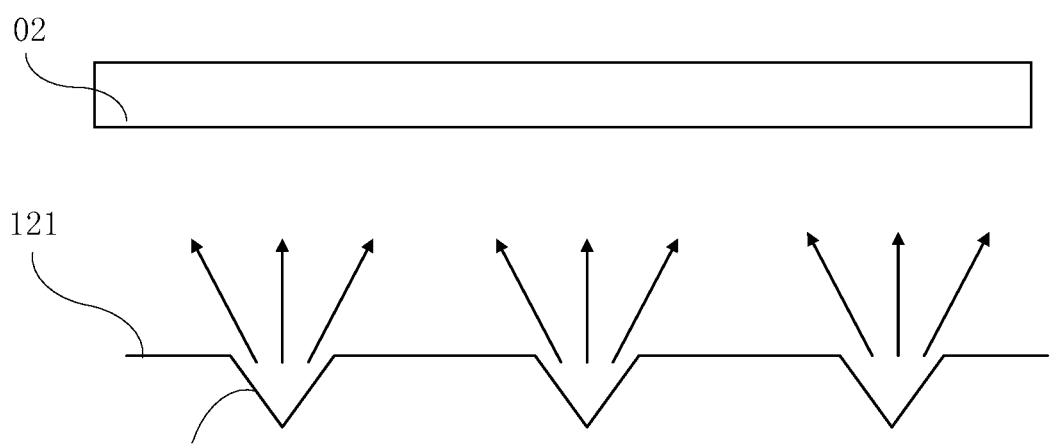
FIG. 4B is a diagram illustrating the light emission of the backlight module as illustrated in FIG. 3.

Therefore, by providing the V-shaped grooves, the majority of the light can be emitted upwards, as shown in FIG. 4B, allowing more light supply to the liquid crystal display panel 02 disposed on the light-emitting side of the backlight module 01, thereby increasing the utilization rate of the light.

Figure 5A:
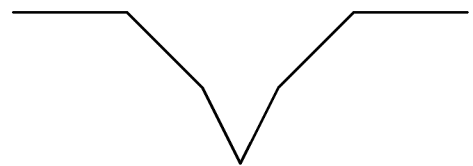
FIG. 5A is a schematic diagram of the V-shaped groove as illustrated in FIG. 3, which is arranged over the substrate according to a first embodiment.
Figure 5B:
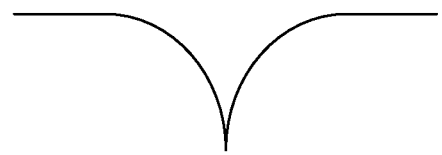
FIG. 5B is a schematic diagram of the V-shaped groove as illustrated in FIG. 3, which is arranged over the substrate according to a second embodiment.
Figure 5C:
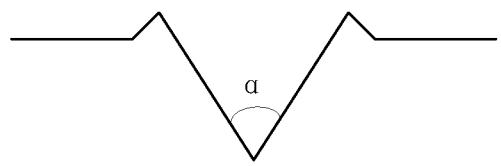
FIG. 5C is a schematic diagram of the V-shaped groove as illustrated in FIG. 3, which is arranged over the substrate according to a third embodiment.

In some embodiments, the grooves can have other shapes, such as U shapes, crescent shapes, trapezoid shapes, inverse trapezoid shapes, etc. For example, the side walls of the grooves can be non-flat surfaces as shown in FIG. 5A, can be curved surfaces, as shown in FIG. 5B. In addition, the opening of the grooves can be designed to allow the layers disposed on the surface of grooves to form bulges at the rims of the groove. Those of ordinary skills in the field can recognize that the angle α of the V-shaped grooves as shown in FIG. 5C can be adjusted to focus or diffuse the light emitted by the active layer 121.

In some embodiments, the grooves can be formed with anisotropic etching. The different surfaces in the grooves can have different epitaxial growth rate. For example, in the case that the side surfaces of a groove afford a higher epitaxial growth rate, quantum wires can be formed at the side surfaces. In another example, a bottom portion of a groove can facilitate a faster growth rate, and a crescent quantum wire can be formed.

Because the first buffer layer 120 and the active layer 121 completely cover the grooves in some embodiments, light can emit from the opening of the grooves when energy level transition occurs for the carriers of the whole active layer 121. In order to increase the number of carriers during energy level transition, and to avoid a relatively large number of layers on the surface of the active layer 121 that reduce the light transmission efficiency, the second electrode 124 can be configured to at least overlap with the two ends of the active layer 121 and the non-overlapping zone 1222 on the side of the active layer 121, as shown in FIG. 3.

Such a configuration allows the whole active layer 121 to extend along the Y axis, and under the effects of the first electrode 10 and the second electrode 124, energy level transitions can occur for the majority of the carriers in the active layer 121, resulting in an increased light output. Additionally, the configuration of the second electrode 124 in the non-overlapping zone 1222 allows the arrangement of relatively small number of layers over the grooves, resulting in a reduced light loss and an increased light output efficiency.

Because the arrangement of the contact layer 123 can increase the conductivity of the second electrode 124, the contact layer 123 can have the same pattern as the second electrode 124, thereby eliminating the need to provide a large number of layers over the top surface of the active layer 121, which tend to reduce the light output efficiency.

The light emitted by the quantum wire laser generator 20 can be natural light, with polarizations at all directions. Therefore, to have a good control of the light, optical films can be provided in the backlight module 01 to polarize the natural light. The following embodiments are provided to illustrate the configurations of the optical films.

Embodiment 1

In this embodiment, the backlight module 01 can be assembled on-cell with the liquid crystal display panel 02 to form a liquid crystal display apparatus.

Figure 6:
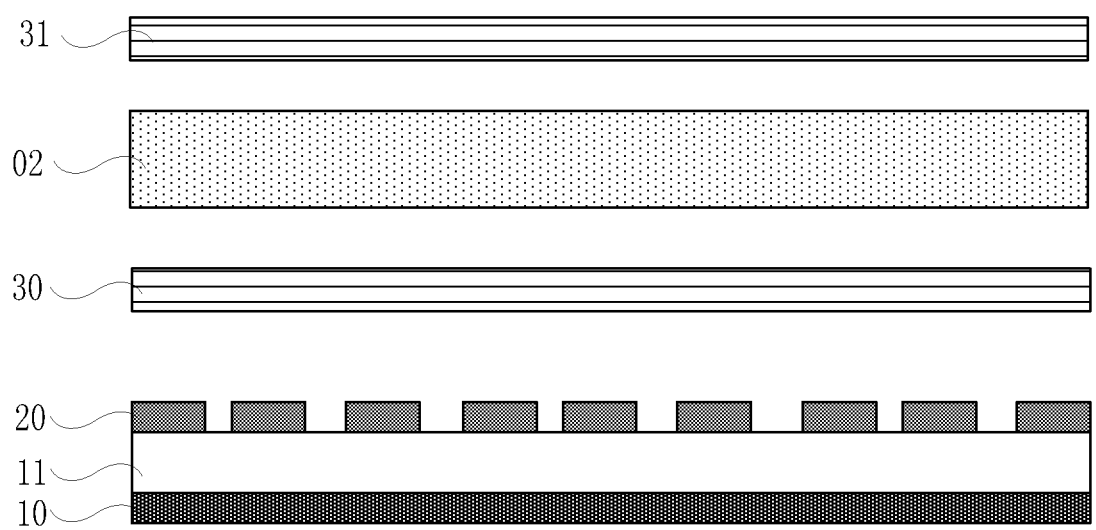
FIG. 6 is a schematic diagram of a display apparatus according to a first embodiment.

As illustrated in FIG. 6, the quantum wire array units 20 can be provided with a lower polarizer film 30 at the light-emitting side, to polarize the light emitted by the quantum wire array units 20, which allows the passing-through of light having a same polarizing direction as the lower polarizer film 30. To realize the control to pass through or block the light, an upper polarizer film 31 can be arranged over the lower polarizer film 30 and at the display side of the liquid crystal display panel 02.

If the upper polarizer film 31 and the lower polarizer film 30 have a same polarizing direction, light emitted by the quantum wire array unit 20 remains to have an unaltered polarizing direction after polarization through the lower polarizer film 30 and passing through the liquid crystal molecules without an electrical field, which then pass normally through the upper polarizer film 31 to ultimately display as a base color. The light emitted by the quantum wire array unit 20 has an altered polarizing direction after polarization through the lower polarizer film 30 and passing through the liquid crystal molecules where an electrical field is applied, which is then unable to pass through the upper polarizer film 31 to thereby display as black.

In situations where the upper polarizer film 31 and the lower polarizer film 30 have their respective polarizing directions perpendicular to each other, the light is able to pass through if an electrical field is applied to the liquid crystal molecules, and is blocked if no electrical field is applied.

The backlight module 01 having the upper polarizer film 31 can be assembled with the liquid crystal display panel 02 to realize the on-cell configuration for the backlight module 01.

Embodiment 2

In this embodiment, an liquid crystal display apparatus can be manufactured by directly fabricating the liquid crystal display panel 02 over the backlight module 01 (in-cell), which requires no assembly between the backlight module 01 and the liquid crystal display panel 02.

Figure 7A:
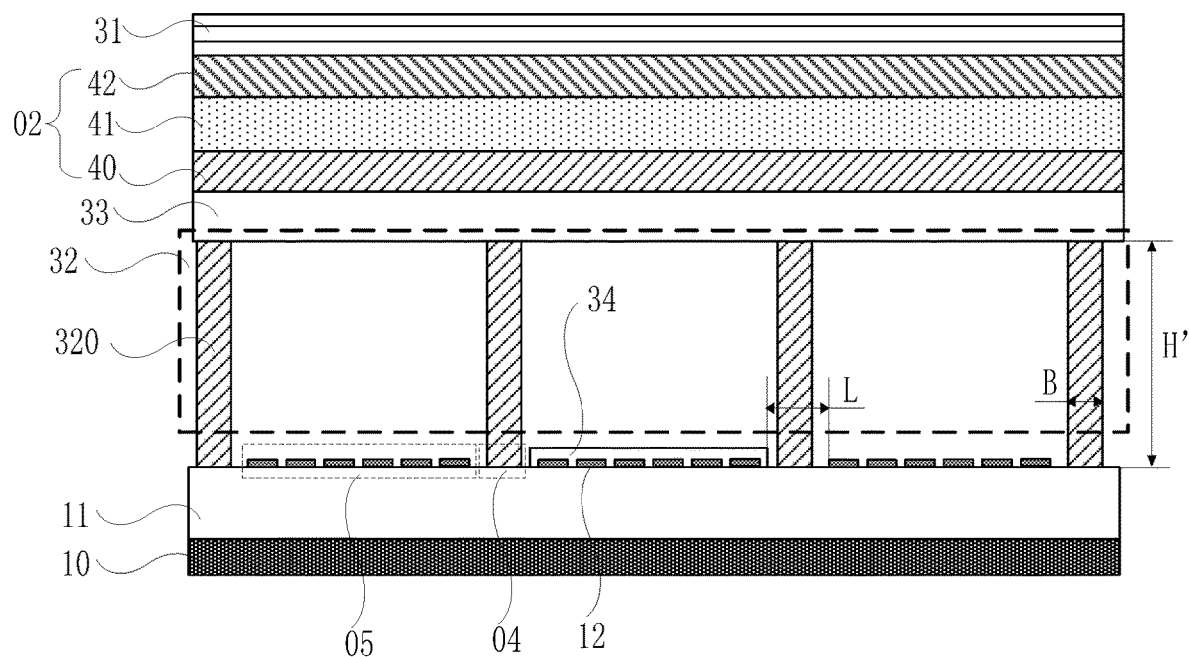
FIG. 7A is a schematic diagram of a display apparatus according to a second embodiment.

Specifically, as shown in FIG. 7A, a backlight module 01 can further comprise a self-polarizing grating 32, disposed on the top surface of the substrate layer. The self-polarizing grating 32 comprises a plurality of shielding portions 320, separated from one another; and between each two neighboring shielding portions 320, a plurality of quantum wire array units 12 are arranged. The plurality of quantum wire array units 12 can be at least two quantum wire array units 12.

The self-polarizing grating 32 can polarize the light emitted from the quantum wire array unit 20, and allow only the light having a same polarizing direction as the self-polarizing grating 32 to pass through. To realize the control to pass through or shut off the light, the self-polarizing grating 32 can function in conjunction with an upper polarizer film 31 arranged on the surface of the liquid crystal display panel 02.

The self-polarizing grating 32 can have a composition of a metal, such as aluminum. The surface of the metal material can be coated with an insulating layer, such as resin, to provide insulation to the self-polarizing grating 32.

The surface of the self-polarizing grating 32 can be provided with a flattening layer 33, configured to flatten the surface of the self-polarizing grating 32. Over the surface of the flat layer 33, a liquid crystal display panel 02 can be directly fabricated. The flattening layer 33 can have a composition of resin, for example, which is insulating.

To manufacture the backlight module 01 as described above, the surface of the substrate layer 11 over which the plurality of quantum wire array units 12 are disposed can be treated to form the pattern for a self-polarizing grating 32 by mask exposure, thereby forming a backlight module 01 containing the self-polarizing grating 32. Each of the separation zones for fabricating any one shielding portion 320 can have a width L of about 100 nm, which facilitates the fabrication of the shielding portions 320 having a width B of 50-80 nm. The height of the shielding portions 320 H' can be 100-150 nm, for example. A self-polarizing grating 32 manufactured based on these parameter ranges can have a high accuracy, and an improved polarizing effect, though at a higher fabrication cost.

The flattening layer 33 can then be fabricated over the surface of the self-polarizing grating 32. In situations where a backlight module 01 comprises an array substrate, the array substrate 40 can be fabricated directly over the surface of the flat layer 33. If the backlight module 01 comprises a color film substrate 42, the color film substrate 42 can be assembled with the backlight module 01 having an array substrate 40, and liquid crystals can then be injected between the color film substrate 42 and the array substrate 40 to form a liquid crystal layer 41. The light-emitting surface of the color film substrate 42 can be attached with an upper polarizer film 31, to complete the manufacturing of the LCD apparatus.

Through the above process, a backlight module 01 with the in-cell configuration can be assembled. The self-polarizing grating 32 can be directly fabricated over the surface of the substrate layer 11, which also provides the surface for manufacturing the quantum wire array units 12.

Compared with the manufacturing method in Embodiment 1, wherein the lower polarizer film 30 is fabricated on the backlight module 01, disposed over the surface of the quantum wire array units 12 and having the On-Cell configuration, the backlight module 01 having the In-Cell configuration in this embodiment can be advantageous in reducing the device thickness.

For the backlight module 01 as described in both Embodiment 1 and Embodiment 2, to allow more light to emit towards the liquid crystal display panel 02, a reflection layer can be provided over both side surfaces (i.e., the front and rear surfaces formed by the X axis and the Z axis, as shown in FIG. 3) of the substrate layer 11 along the extending direction of the quantum wire array units 12 (the Y axis). The reflection layer can have a composition of a reflection-enhancing material, with a reflection rate of >95%. The light emitted from the two ends of the V-shaped grooves can be reflected by the reflection layer, resulting in an increased light utilization rate.

In some embodiments, to prevent the environmental factors, such as vapor, oxygen and heat, from affecting the quantum wire array units 12, a packaging layer 34 can be disposed over the surface of the at least one quantum wire array unit 12, and can have a composition of epoxy resin, which has a good water/oxygen blocking property.

Figure 7B:
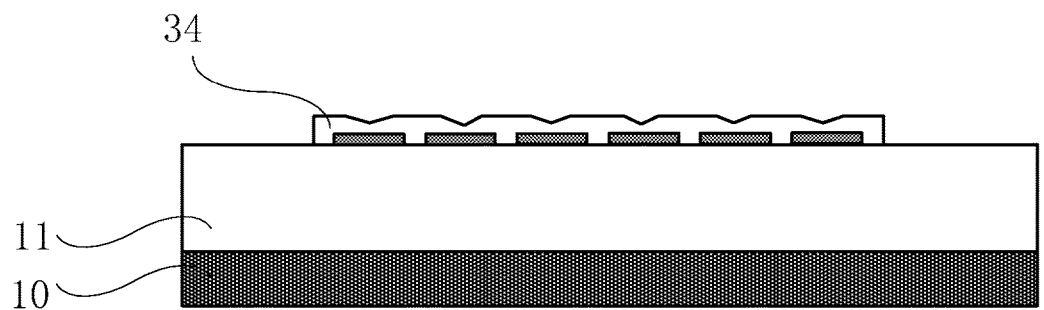
FIG. 7B is a schematic diagram of the display apparatus as illustrated in FIG. 7A, of which packaging layer is configured to have an uneven surface.

In some embodiments, the packaging layer 34 can have a flat surface, as illustrated in FIG. 7A, or have a non-flat surface, as shown in FIG. 7B. By modifying the bulges and recesses of the non-flat surfaces, types of the light emitted from the quantum wire array unit 12 can be adjusted.

In some embodiments, a display apparatus is provided, as shown in FIG. 6 or FIG. 7A. The display apparatus includes a liquid crystal display panel 02, and a backlight module 01 according to any of the embodiments as described above. The backlight module 01 can be disposed at a non-light-emitting side of the liquid crystal display panel 02. The backlight module 01 in the display apparatus can have some structures and advantages similar to some other embodiments.

The display apparatus according to some embodiments can be a liquid crystal display device, such as a liquid crystal monitor, a liquid crystal TV, a digital camera, a cell phone, a tablet computer, or any of the products or components having a display function. The display apparatus can be a direct-lit type, yet can be much thinner than conventional back-lit type LCDs.

Figure 8:
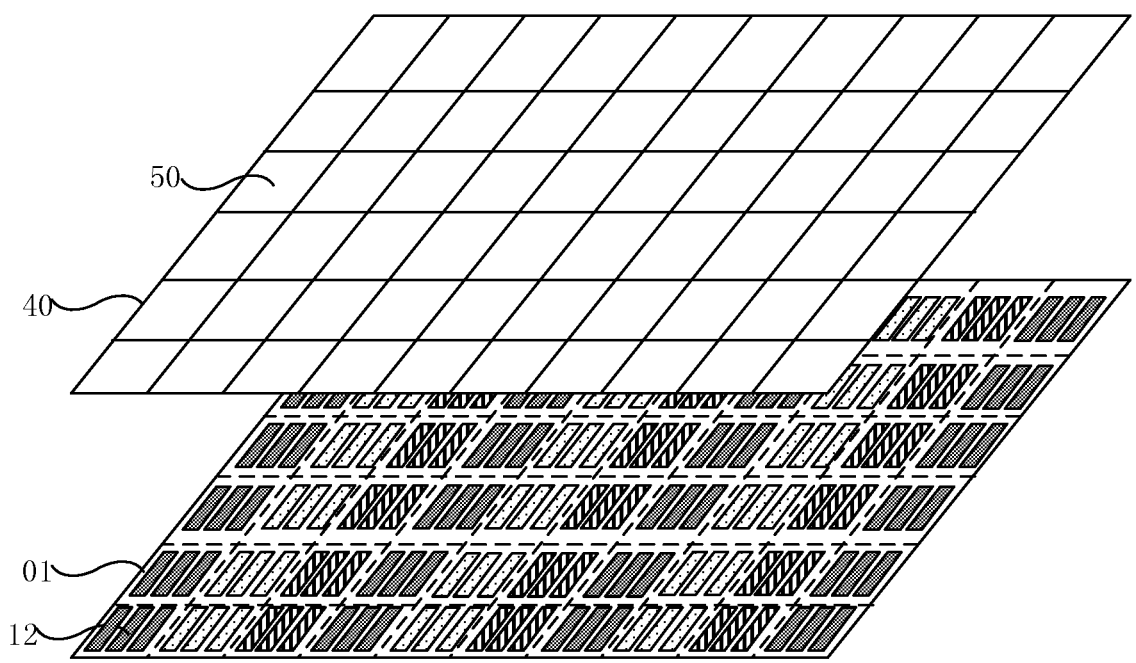
FIG. 8 is a schematic diagram of a configuration of the backlight module and the array substrate according to some embodiments.

A liquid crystal display panel 01, as shown in FIG. 7A, can include an array substrate 40, and a liquid crystal layer 41 disposed over a side of the array substrate opposite to the backlight module 01. The array substrate 40, as shown in FIG. 8, can include a plurality of pixels 50 arranged in a matrix. Each pixel 50 corresponds to a set of quantum wire array unit 12 which comprise at least one quantum wire array unit 12. By modifying types and colors of the light emitted from the set of quantum wire array units 12, the color of each pixel 50 can be modified. It should be noted that the array substrate 40 as shown in FIG. 8 is only for illustration purpose only, and there is no limitation on the configuration herein.

Embodiment 3

Figure 9:
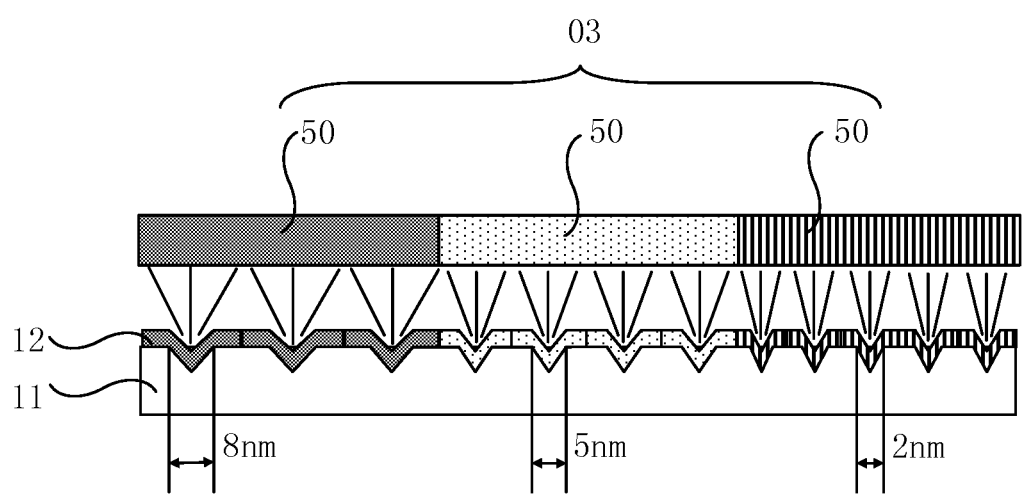
FIG. 9 is a schematic diagram of the working principle whereby a backlight module according to some embodiments emits light of three primary colors.

In some embodiments, a backlight module 01 as illustrated in FIG. 9 can emit light of three primary colors.

Specifically, each of the set of quantum wire array units 12 corresponding to one of the three pixels in a pixel unit 03 can be configured to have different effective wire widths to emit light of different wavelengths. The three primary colors can be blue, green, and red, or can be cyan, yellow, and magenta, or other selections.

If the three sets of quantum wire array units 12 corresponding respectively to the three pixels in a pixel unit 03 are configured to emit lights of blue, green, and red, the set of quantum wire array units 12 can be configured to have an effective wire width of 2 nm for its corresponding pixel 50 to emit a blue light, an effective wire width of 5 nm for its corresponding pixel 50 to emit a green light, and an effective wire width of 8 nm for its corresponding pixel 50 to emit a red light, for example. As such, the backlight module 01 itself can provide light of three primary colors, eliminating the need for manufacturing a color film substrate 42 and resulting in a reduced thickness of the display apparatus.

In some embodiments, three sets of quantum wire units are distributed periodically across the backlight module, with three sets of quantum wire array units of the three primary colors forming a period and having a size comparable to but smaller than the size of the pixel unit 03.

In some embodiments, the effective wire width can be defined as the width of the electric field formed in the quantum wire array unit 12 upon application of a voltage difference to the first electrode 10 and the second electrode 124, corresponding to an area supplying a majority of the light source. For the quantum wire array unit 12 formed over the substrate layer 11 having the V-shaped groove, if a voltage difference is applied to the first electrode 10 and the second electrode 124, an electrical field forms only at the V-shaped groove, and the majority of the light emits from the V-shaped groove. In this case, the effective wire width can be the width of the V-shaped groove.

Because the backlight module 01 itself can emit light of three primary colors, pixels 50 as shown in FIG. 9 can have different colors. It should be noted that the backlight module as shown in FIG. 9 is only for illustration purpose only, and there is no limitation herein.

Embodiment 4

In this embodiment, the backlight module 01 emits light of only one color.

Figures 10, 11:
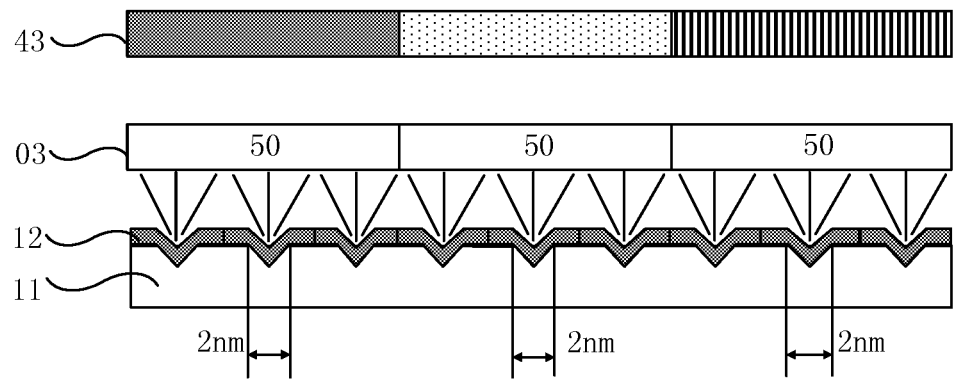
FIG. 10 schematic diagram of the working principle whereby a backlight module according to some embodiments emits light of a mono-color.
FIG. 11 is a flow chart of a method for fabricating a backlight module according to some embodiments.

As shown in FIG. 10, the wires in each of the three sets of quantum wire array unit 12 corresponding respectively to the three pixels in a pixel unit 03 can be configured to have a same effective wire width, for example, 2 nm, to emit blue light.

A photoluminescent layer 43 can be disposed over the light-emitting side of the liquid crystal display panel 02.

Different photoluminescent materials, such as organic fluorescent powder, photoluminescent quantum dots, etc., can be disposed at different zones of the pixels 50 in the pixel unit 03 corresponding to different regions in the photoluminescent layer 43. Upon excitation by the blue light, three pixels 50 in the pixel unit 03 can respectively emit blue light, red right, and green light, which together can be combined to emit white light from the pixel unit 03.

Because the backlight module 01 in this embodiment is configured to generate light of only one color, the pixels 50 as shown in FIG. 10 have the same shading, in contrast to Embodiment 3. It should be noted that the backlight module as shown in FIG. 10 is only for illustration purpose only, and there is no limitation herein.

In another embodiment of the backlight module (not shown in drawings), each pixel can correspond to one set of quantum wire units, comprising three sub-sets of quantum wire units. The three sub-sets of quantum wire units can be configured to generate three different primary colors which together can be combined to form white light.

In another aspect, a method of manufacturing a backlight module 01 is provided. With reference to the flow chart in FIG. 11, the method can include the following steps:

S101: forming a quantum wire array 05 (see, e.g., FIG. 2E) over a top surface of the substrate layer 11 (see, e.g., FIG. 2A), the quantum wire array 05 comprising a plurality of quantum wire array units 12.

The step of forming the quantum wire array 05 can comprise: sequentially forming patterns of a first buffer layer 120, an active layer 121, a second buffer layer 122, and a second electrode 124 over the substrate layer 11 via a quantum wire growth process. The second buffer layer 122 can completely cover the first buffer layer 120 and the active layer 121; the second buffer layer 122 can includes an overlapping zone 1221 where the second buffer layer 122 overlaps with the first buffer zone 120, and a non-overlapping zone 1222 besides the overlapping zone 1221. The second electrode 124 and the active layer 121 are disposed at least to overlap with part of the overlapping zone 1221.

A contact layer 123 can be additionally provided between the second buffer layer 122 and the second electrode 124.

S102: forming a first electrode 10 over a bottom surface of the substrate layer 11.

The substrate layer can provide a growth substrate for the various layers in the quantum wire array units. The first buffer layer can be configured to separate the active layer and the substrate layer; the second buffer layer can be configured to separate the active layer and the contact layer.

A quantum wire array unit, together with part of the substrate layer and the first electrode at corresponding positions can form a quantum wire laser generator, in which the carriers can have a scale effect and be confined in the potential wells formed in the active layer, to form different quantum energy levels. Upon application of voltage difference to the first electrode and the second electrode, energy level transitions can occur for the carriers to generate photons, so as to induce the backlight module to emit light and provide a backlight source.

According to some embodiments, there is no need to provide a light guide plate, a diffusion plate, or multiple optical films in the backlight module. Based on the working principles of the quantum wire laser generator, the active layer can have a nanometer-scale thickness, and other films can also have nanometer-scale thickness in some embodiments. These thin layers allow for a reduction in the overall thickness of the backlight module. As a result, thinner display apparatuses can be achieved.

Prior to the step S101, the method can further include: Forming V-shaped grooves on the top surface of the substrate layer 11 via an etching process.

After forming the V-shaped grooves, the step S101 can include: forming each of the quantum wire array units 01 at positions corresponding to each of the V-shaped grooves, wherein the first buffer layer 120 and the active layer 121 can completely cover the V-shaped grooves.

The V-shaped grooves can facilitate the growth of the first buffer layer 120 and the active layer 121 along the Y axis, in turn facilitating the formation of the quantum wires. If the surface of the substrate layer 11 is not provided with V-shaped grooves, the light emitted by the active layer 121 in the quantum wire array unit 12 can diffuse to various directions as shown in FIG. 4A, which can reduce the utilization rate of the light in the backlight module 01.

Thus, by arranging the V-shaped grooves, the majority of the light is emitted upwards, as shown in FIG. 4B, allowing more light supply into the liquid crystal display panel 02 disposed over the light-emitting side of the backlight module 01, resulting in an increased utilization rate of the light.

Because the first buffer layer 120 and the active layer 121 completely cover the V-shaped grooves according to some embodiments, light emits from the opening of the V-shaped grooves when energy level transitions occur for the carriers of the active layer 121. To increase the number of carriers during energy level transitions and to avoid the relatively large number of layers on the surface of the active layer 121 that tend to reduce the light emission efficiency, the second electrode 124 can be configured to at least overlap with the two ends of the active layer 121 and the non-overlapping zone 1222 at the side of the active layer 121, as illustrated in FIG. 3.

This configuration allows the whole active layer 121 to extend along the Y axis, and under the effects of the first electrode 10 and the second electrode 124, energy level transitions can occur for the majority of the carriers in the active layer 121, resulting in an increased light output. Additionally, configuration of the active layer 121 in the non-overlapping zone 1222 allows a relatively small number of layers over the V-shaped grooves, resulting in a reduced loss and an increased light output efficiency.

The step of forming the quantum wire array 05 over the top surface of the substrate layer 11 can include arranging a separation zone 04 between each two quantum wire arrays 05. The separation zone 04 can have a length of L.

After forming the quantum wire array 05, the method can further include forming shielding portions 320 of the self-polarizing grating 32 over the top surface of the substrate layer 11 at positions corresponding to the separation zones 04.

For example, the width of a quantum wire array unit 12 can be 2-8 nm, and the fabrication method as described above can reduce the cost resulting from the overly high manufacturing accuracy. Adopting the above parameter ranges can also prevent a decrease of the quantum scale effect of the quantum wires due to an overly large width of the quantum wire array unit 12.

In some embodiments, a plurality of such quantum wire array units can be arranged in series over the substrate layer 11 to form a first quantum wire array 05. If the quantum wire array 05 reaches a width of 50-80 nm, a second quantum wire array 05 can then be fabricated with a separation zone having a length L of about 100 nm. A third quantum wire array, etc, can be fabricated, until a plurality of quantum wire arrays 05 are fabricated over the top surface of the substrate layer 11.

The plurality of separation zones can then be processed via mask exposure and etching to form a plurality of shielding portions 320 with a width B of about 50-80 nm, and a height H' of 100-150 nm.

The self-polarizing grating 32 manufactured based on these parameter ranges can have a good polarizing effect while avoiding an overly high cost due to an overly high manufacturing accuracy.

Although specific embodiments have been described above in detail, the description is merely for purposes of illustration. It should be appreciated, therefore, that many aspects described above are not intended as required or essential elements unless explicitly stated otherwise. Various modifications of, and equivalent acts corresponding to, the disclosed aspects of the exemplary embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

The invention claimed is:

1. A backlight module, comprising at least one quantum wire unit, wherein:
   the at least one quantum wire unit is configured to have an effective wire width such that the at least one quantum wire unit is capable of converting electric energy to emit light of a selected wavelength; and
   each of the at least one quantum wire unit comprises:
   a first electrode, disposed on a first side of a substrate layer;
   a first buffer layer, disposed on a second side of the substrate layer;
   an active layer, disposed over the first buffer layer;
   a second buffer layer, disposed over the active layer; and
   a second electrode disposed over the second buffer layer; wherein:
   each of the at least one quantum wire unit, along with the substrate layer, forms a quantum wire laser generator, configured such that the active layer emits light upon application of a voltage difference between the first electrode and the second electrode.

2. The backlight module of claim 1, wherein in each of the at least one quantum wire unit,
   the second buffer layer comprises an overlapping portion, disposed over the first buffer layer and the active layer; and at least one non-overlapping portion, disposed over the substrate layer but not over the first buffer layer and the active layer; and
   the second electrode comprises two end portions and a middle portion, wherein:
   the two end portions of the second electrode are disposed over the overlapping portion of the second buffer layer at two end portions of the each of the at least one quantum wire unit along the dimension of length; and
   the middle portion of the second electrode is disposed over the at least one non-overlapping portion of the second buffer layer at a middle portion of the each of the at least one quantum wire unit along the dimension of length.

3. The backlight module of claim 2, wherein each of the at least one quantum wire unit further comprises a contact layer, sandwiched between the second buffer layer and the second electrode and configured to increase a conductivity of the second electrode.

4. The backlight module of claim 1, wherein at least one groove is arranged on a surface of the second side of the substrate layer, and is configured to facilitate formation of, the active layer of one of the at least one quantum wire unit on the second side of the substrate layer.

5. The backlight module of claim 4, wherein each of the at least one groove takes a shape to thereby allow forming the active layer being free to grow along an extension direction of the groove, but having a quantum well effect excluding the extension direction of the groove.

6. The backlight module of claim 5, wherein the shape is selected from one of V-shape, U-shape, crescent shape, trapezoid shape, or inverse trapezoid shape.

7. The backlight module of claim 5, wherein each of the at least one groove is configured to have bulges at rims of opening of the each of the at least one groove.

8. The backlight module of claim 1, further comprising a packaging layer, disposed over surface of the at least one quantum wire unit.

9. The backlight module of claim 1, wherein the active layer comprises at least one of Si, Ge, Carbon nanotube, GaAs, InGaAs, AlGaAs, InAs, InP, InN, GaN, ZnO, $ZnO_2$, CdMnTe, ZnSe, or SiC.

10. The backlight module of claim 1, further comprising at least one reflection layer, wherein:
- each of the at least one reflection layer is disposed on a side surface of the substrate layer, wherein the side surface of the substrate layer is perpendicular to the dimension of length of the at least one quantum wire unit; and
- each of the at least one reflection layer is configured to reflect light emitted from at least one of the two end portions of the at least one quantum wire unit.

11. A display apparatus, comprising a backlight module according to claim 1.

12. The display apparatus according to claim 11, further comprising a lower polarizer film, an upper polarizer film, and a liquid crystal display panel, wherein:
- the lower polarizer film is disposed over a light-emitting side of the backlight module;
- the liquid crystal display panel is disposed over a top side of the lower polarizer film; and
- the upper polarizer film is disposed over a top side of the liquid crystal display panel.

13. The display apparatus according to claim 11, further comprising a self-polarizing grating, disposed over the top side of the substrate layer in the backlight module and configured to modulate light emitted from the quantum wire array, wherein:
- the at least one quantum wire unit in the backlight module form a plurality of quantum wire arrays, arranged such that a separation zone is arranged between every two neighboring quantum wire arrays on the top side of the substrate layer; and
- the self-polarizing grating comprises a plurality of shielding portions, separated from one another, and each of the plurality of shielding portions is disposed within the separation zone.

14. The display apparatus according to claim 13, wherein the separation zone is around 50 nm, and each of the plurality of shielding portions has a width of around 50-80 nm and a height of around 100-150 nm.

15. The display apparatus according to claim 13, further comprising an upper polarizer film, wherein:
- the upper polarizer film is disposed over a light-emitting side of the self-polarizing grating.

16. The display apparatus according to claim 15, wherein the liquid crystal display panel comprises an array substrate, wherein:
- the array substrate comprises a plurality of pixels, and
- each of the plurality of pixels corresponds to one set of quantum wire unit, wherein the one set of quantum wire unit comprises at least one quantum wire unit.

17. The display apparatus of claim 16, wherein three sets of quantum wire units corresponding respectively to three pixels in a pixel unit are configured to have different effective wire widths so as to emit light of three primary colors, selected from blue, red, and green, or cyan, yellow, and magenta.

18. The display apparatus of claim 16, wherein each set of quantum wire units corresponding respectively to one pixel comprises three sub-sets of quantum wire units, configured to have different effective wire widths so as to emit light of three primary colors, selected from blue, red, and green, or cyan, yellow, and magenta.

19. The display apparatus of claim 16, wherein:
- each quantum wire unit have a same effective wire width and thereby emit light of a same color; and
- the liquid crystal display panel further comprises a color film substrate, wherein: the display apparatus further comprises a photoluminescent layer;
- the photoluminescent layer is disposed over a top side of the array substrate; and
- the color film substrate is disposed over the photoluminescent layer and below the upper polarizer film.

* * * * *